(12) United States Patent
Chang et al.

(10) Patent No.: US 6,949,781 B2
(45) Date of Patent: Sep. 27, 2005

(54) METAL-OVER-METAL DEVICES AND THE METHOD FOR MANUFACTURING SAME

(75) Inventors: Chung-Long Chang, Dou-Liu (TW); Chun-Hon Chen, Jhubei (TW)

(73) Assignee: Taiwan Semiconductor Manufacturing Co. Ltd. (TW)

( * ) Notice: Subject to any disclaimer, the term of this patent is extended or adjusted under 35 U.S.C. 154(b) by 102 days.

(21) Appl. No.: 10/683,900

(22) Filed: Oct. 10, 2003

(65) Prior Publication Data

US 2005/0077581 A1 Apr. 14, 2005

(51) Int. Cl.⁷ .................. H01L 27/108; H01L 29/76; H01L 29/94; H01L 31/119
(52) U.S. Cl. ...................... 257/296; 257/307
(58) Field of Search .................. 257/296, 300, 257/303, 306, 307, 308, 532, 393, 758

(56) References Cited

U.S. PATENT DOCUMENTS

| | | | |
|---|---|---|---|
| 5,208,725 A | 5/1993 | Akcasu | |
| 5,583,359 A | 12/1996 | Ng et al. | |
| 6,383,858 B1 * | 5/2002 | Gupta et al. | 438/238 |
| 2002/0093780 A1 | 7/2002 | Hajimiri et al. | |

* cited by examiner

Primary Examiner—Hoai Pham
Assistant Examiner—Dilinh Nguyen
(74) Attorney, Agent, or Firm—Duane Morris LLP (57) ABSTRACT

A metal-over-metal (MOM) device and the method for manufacturing same is provided. The device has at least one device cell on a first layer comprising a frame piece and a center piece surrounded by the frame piece. The center piece has a cross-shape center portion defining four quadrants of space between the frame and center pieces. The center piece has one or more center fingers each extending from at least one of the four ends thereof within a quadrant. The frame piece also has one or more frame fingers extending therefrom, each being in at least one quadrant and not being overlapped with the center finger in the same quadrant.

19 Claims, 8 Drawing Sheets

METAL-OVER-METAL DEVICES AND THE METHOD FOR MANUFACTURING SAME

BACKGROUND OF THE DISCLOSURE

The present invention relates generally to semiconductor manufacturing processes, and more particularly, to a method and system for the fabrication of a metal-over-metal(MOM) device structure for integrated circuit devices.

In integrated circuit design there are many applications of high-performance, on-chip capacitors. These applications include dynamic random access memories, voltage control oscillators, phase-lock loops, operational amplifiers, and switching capacitors. Such on-chip capacitors can also be used to decouple digital and analog integrated circuits from the noise of the rest of the electrical system.

The development of capacitor structures for integrated circuits has evolved from the initial parallel plate capacitor structures comprised of two conductive layers, to trench capacitor designs, MOM designs and more recently to the interdigitated metal finger structures. The parallel plate capacitor is typically comprised of a first and second layer of conductive material patterned to define top and bottom electrodes, with an intervening layer of a thin capacitor dielectric, the structure being isolated from the substrate by an underlying dielectric layer of thick field oxide. The bottom electrode typically comprises a layer of conductive material, often polysilicon, which forms other structures of the integrated circuit, such as gate electrodes or emitter structures of transistors. The second (top) electrode is defined thereon by a second conductive layer, typically another polysilicon layer. The capacitor dielectric is conventionally a thin silicon dioxide or silicon nitride layer. One of the well-known shortcomings of this parallel plate capacitor structure is the relatively large area of the chip required for each device which makes it a less area-efficient structure for advanced chip designs.

Trench capacitors are conventionally formed by depositing conductive and dielectric layers within trench regions defined in the substrate. Typically, an oval or circular vertical cylinder is etched into the substrate and concentrically arranged vertical electrodes are formed inside the trench. Trench capacitors exploit the downward vertical dimension into the substrate to create each capacitor device thereby reducing overall lateral dimensions of the chip which translates to reduced cost. A primary drawback to trench capacitors, however, is their lack of scalability as feature sizes shrink. Economically etching the trenches becomes difficult as the narrow trench openings and high aspect ratios cause extended trench etch times limited by diffusion of the etching chemistry into and out of the trenches.

More recently, interdigitated finger capacitor structures have been designed which exploit both the lateral and vertical electric fields between the electrodes thereby creating higher capacitance values per unit area than previous capacitor designs. Unfortunately, these designs have structural limitations which makes them less desirable to utilize within design libraries and limit their flexibility within circuit designs.

What is needed is a method to provide a unit cell capacitor structure that achieves high unit capacitance by exploiting both the lateral and vertical electric field components.

SUMMARY OF THE DISCLOSURE

To address the above discussed limitations in the prior art, the present disclosure provides a modular unit or cell for constructing a metal-over-metal (MOM) device and the method for manufacturing same. In one embodiment, the MOM device may only have a single device layer. The device has at least one device cell on a first layer comprising a frame piece and a center piece surrounded by the frame piece. The center piece has a cross-shape center portion defining four quadrants of space between the frame and center pieces. The center piece has one or more center fingers each extending from at least one of the four ends thereof within a quadrant. The frame piece also has one or more frame fingers extending therefrom, each being in at least one quadrant and not being overlapped with the center finger in the same quadrant.

In another example, a plurality of device layers are used, each being separated vertically by intervening layers of dielectric material. In another embodiment, the capacitor structure may be comprised of an array of the device cells, either on a single layer or a plurality of layers.

The MOM device can be easily integrated with aluminum or copper metal processes with no additional process steps. Additionally, the capacitor structure will provide a plurality of layout and interconnect options integratable into a process cell. Using such a MOM device as a capacitor based device, high unit capacitance can be realized.

DETAILED DESCRIPTION

A metal-over-metal (MOM) device and the method to manufacture same is provided. Those skilled in the art should know that a plurality of conductive materials may be used in the formation of the electrodes of a capacitor. Each electrode may be comprised of a different conductive material such as copper, aluminum, titanium nitride clad titanium, doped poly silicon, or another conductive material system. For simplicity, regardless of what specific type of metal is used, such a device is referred to as a MOM device henceforth.

Figure 1A:
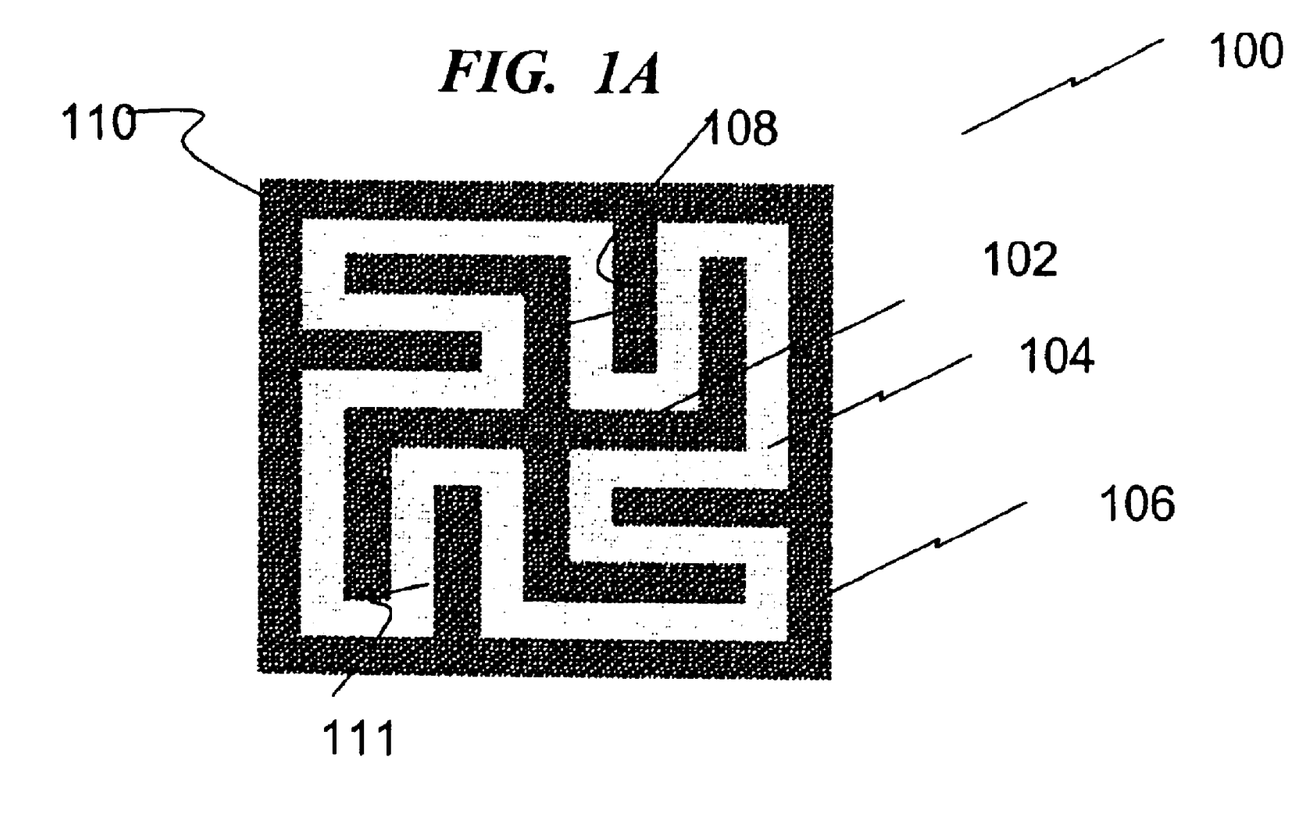
FIG. 1A illustrates one embodiment of the disclosure for one of the two layers required to build a MOM or POP capacitor device.

Referring initially to FIG. 1A, illustrated is one embodiment of a simple schematic view of a capacitor structure 100 according to one example of the present invention. The capacitor structure 100 includes a first electrode 102, a dielectric layer 104, and a second electrode 106. As illustrated, the second electrode element 106 is formed by a frame piece, and the first electrode element 102 is formed by a center piece, surrounded by the frame piece, having a cross-shape center portion 108 defining four quadrants of space between the frame and center piece. As can be seen, the center piece has four center fingers 110 each extending from one of the four ends thereof within a quadrant. The frame piece 106 also has four frame fingers extending therefrom and each being in one quadrant and not being overlapped with the center finger in the same quadrant.

It is understood that although the center portion, the center fingers, the frame piece, and the frame fingers are described as separate entities for illustration purposes, the center fingers and the center portion can be formed as a single piece, and similarly, the frame fingers and the frame piece can be formed as a single piece.

Figure 1B:
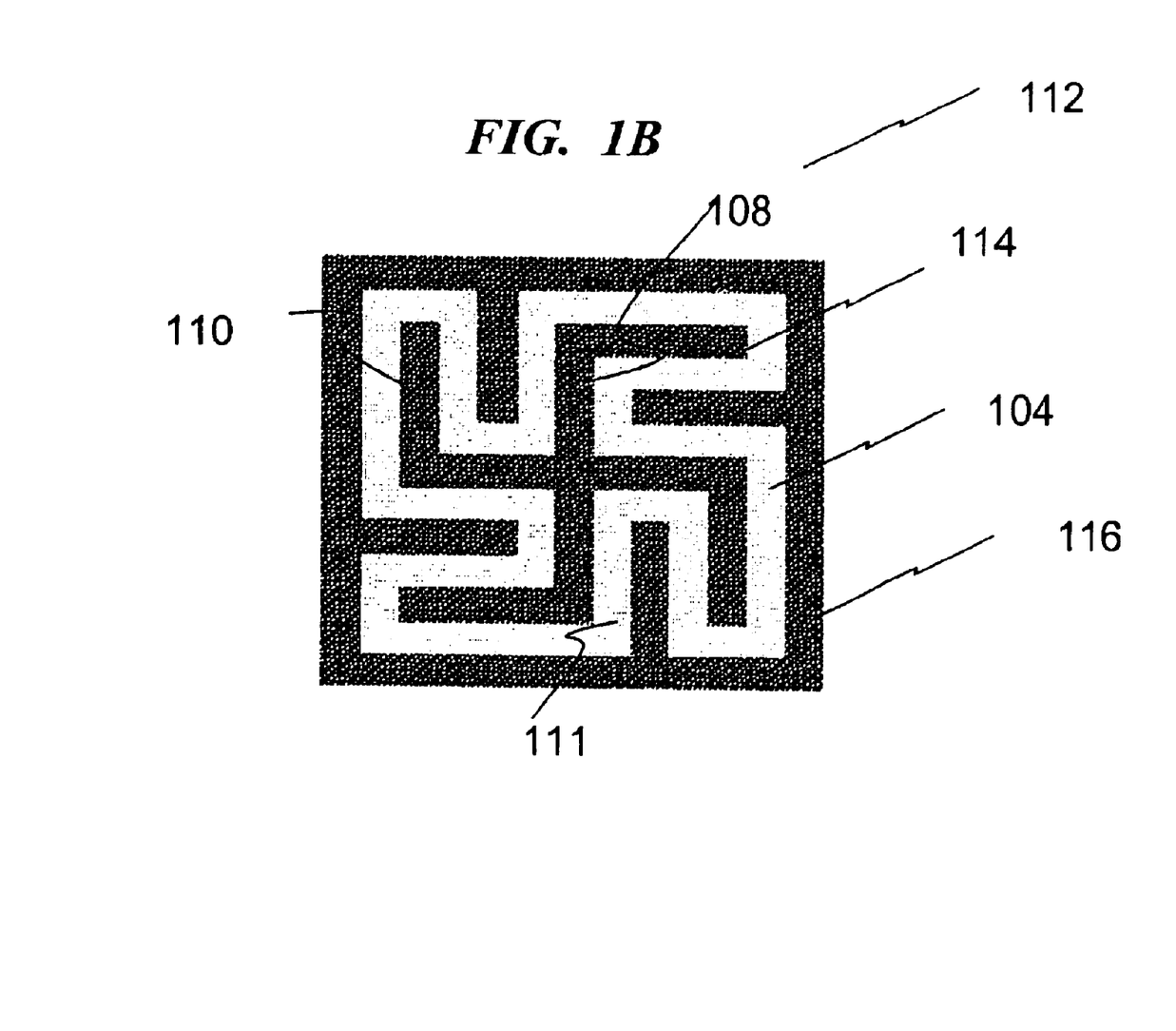
FIG. 1B illustrates one embodiment of the disclosure for the second of two layers required to build a MOM or POP capacitor device.

FIG. 1B illustrates a second embodiment of a schematic view of a capacitor structure 112 covered by the present invention. The capacitor structure 112 includes a first electrode 114, a dielectric layer 104, and a second electrode 116. As illustrated, the second electrode element 116 is formed by the frame piece, and the first electrode element 114 is formed by the center piece, surrounded by the frame piece, having a cross-shape center portion defining four quadrants of space between the frame and center piece. As can be seen, the center piece has four center fingers each extending from one of the four ends thereof within a quadrant, and the frame piece has four frame fingers extending therefrom and each being in one quadrant and not being overlapped with the center finger in the same quadrant. One having skill in the art knows that interconnects made to center piece and frame piece electrodes complete the formation of a planar capacitor structure in 100 and similarly in 112. It is noticed that the structure shown in FIG. 1A is similar to FIG. 1B with the frame fingers and the center fingers arranged differently. For illustration purposes, the structure in FIG. 1A is referred to as a clockwise design and the one in FIG. 1B is referred to as a counter-clockwise design. As will be shown below, these two different designs can be incorporated together in an MOM device Furthermore, in order to achieve higher capacitance, structures 100 and 112 may be stacked in a substantially vertical fashion in a plurality of layers interconnected with one or a plurality of vias between the electrode layers. It understood that when two metal layers are vertically aligned, if both of them are of either the clockwise or counter-clockwise design, then, the via can be made at any location in the center and frame pieces as they overlap in space, although separated by the insulating layers. This would be the simplest design for stacking up metal layers to construct MOM devices.

Alternatively, metal plates of the clockwise and counter-clockwise designs can be stacked up alternately so that the center piece electrode can be connected to the frame piece electrode. Having this capability is very useful because external contacts can now all be made through connection on the frame pieces without having to have route through the frame piece to reach the hard-to-access center piece.

Figure 2A:
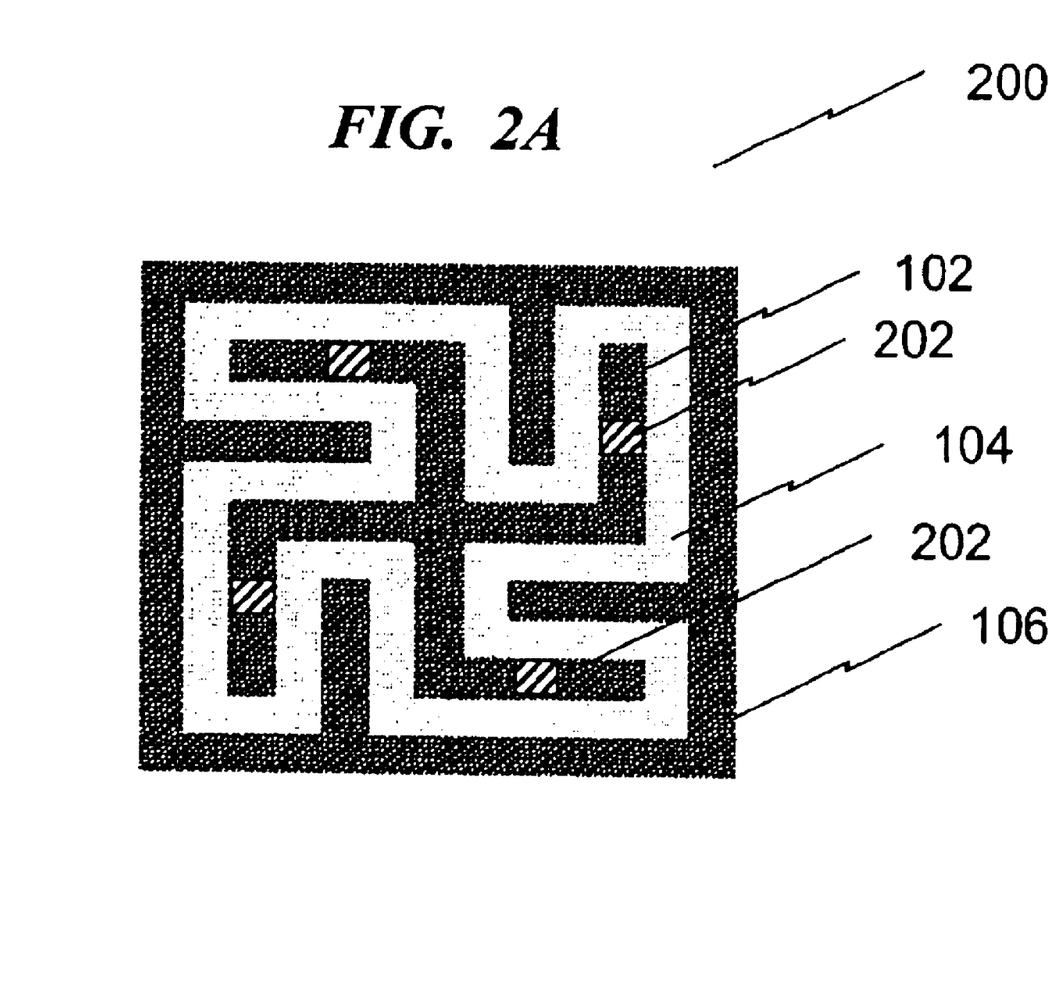
FIG. 2A illustrates one embodiment for the via layout for the layer illustrated in FIG. 1A to connect one polarity parallel electrode to the same polarity electrode in an upper or lower layer.
Figure 2B:
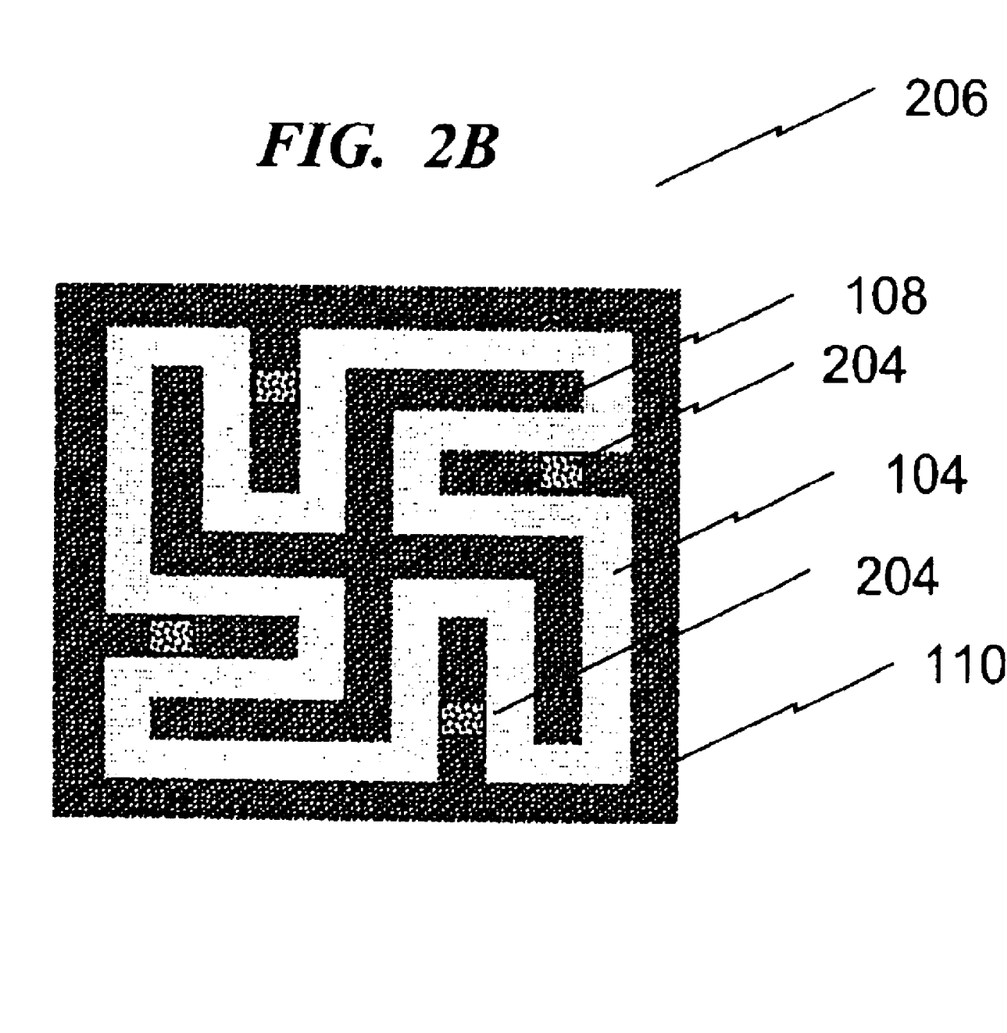
FIG. 2B illustrates one embodiment for the via layout for the layer illustrated in FIG. 1B to connect one polarity parallel electrode to the same polarity electrode in a upper or lower layer.

Referring to FIGS. 2A and 2B illustrate via interconnect schemes on the capacitor structure for connecting electrodes on different metal layers. The center piece electrode 102 is separated from the frame piece electrode 106 by the dielectric 104. Via locations 202 on the center piece 102 in layer 200 are interconnected to via locations 204 on the frame piece 110 in another layer 206 through an intervening layer of dielectric 104 separating layers 200 and 206. Naturally, those having skill in the art know that the dielectric material may be one of several, such as silicon dioxide, silicon nitride, tantalum pentoxide, or a ferroelectric material. It is also well known that the dielectric layer 104 may change in composition, thickness or both, from stacked layer to stacked layer, depending on the process technology employed to construct the device. As shown, the capacitor in FIG. 2A is a counter-clockwise design and the one in FIG. 2B is a clockwise one. It can be seen that when stacking these together, the center piece in FIG. 2A is connected to the frame piece in FIG. 2B. Since there is always a frame piece, to align them in production is very practical.

Figure 3A:
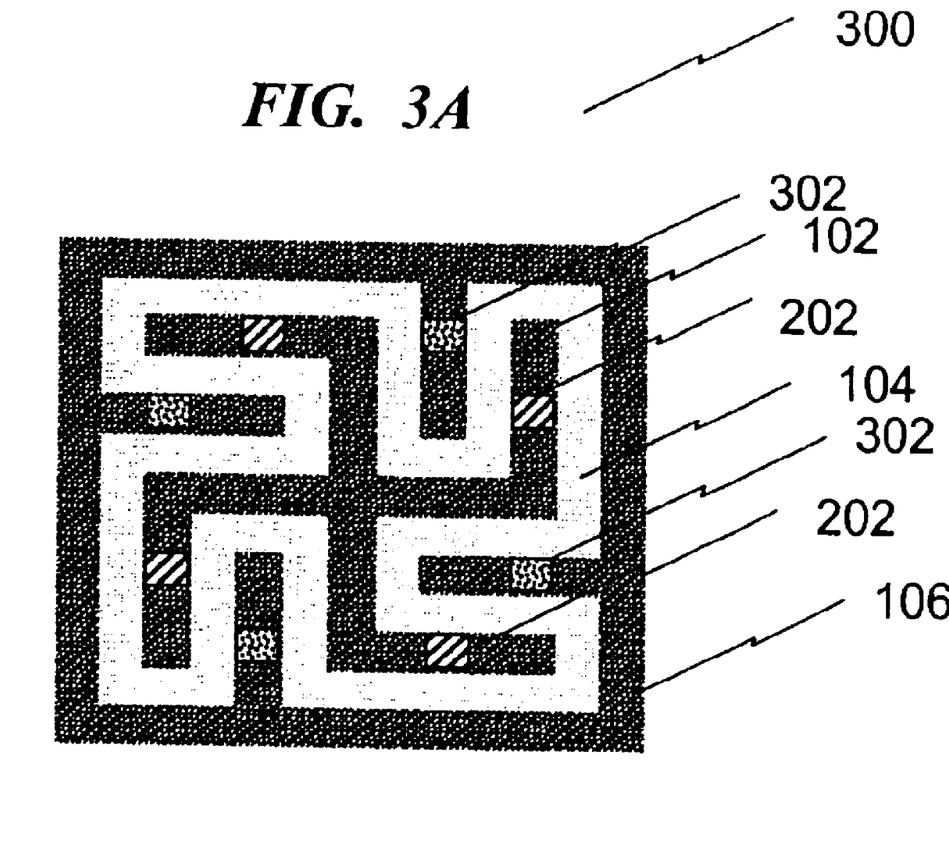
FIG. 3A illustrates one embodiment for the via layout for FIG. 1A to connect each polarity parallel electrode to the like polarity electrode in an upper or lower layer.
Figure 3B:
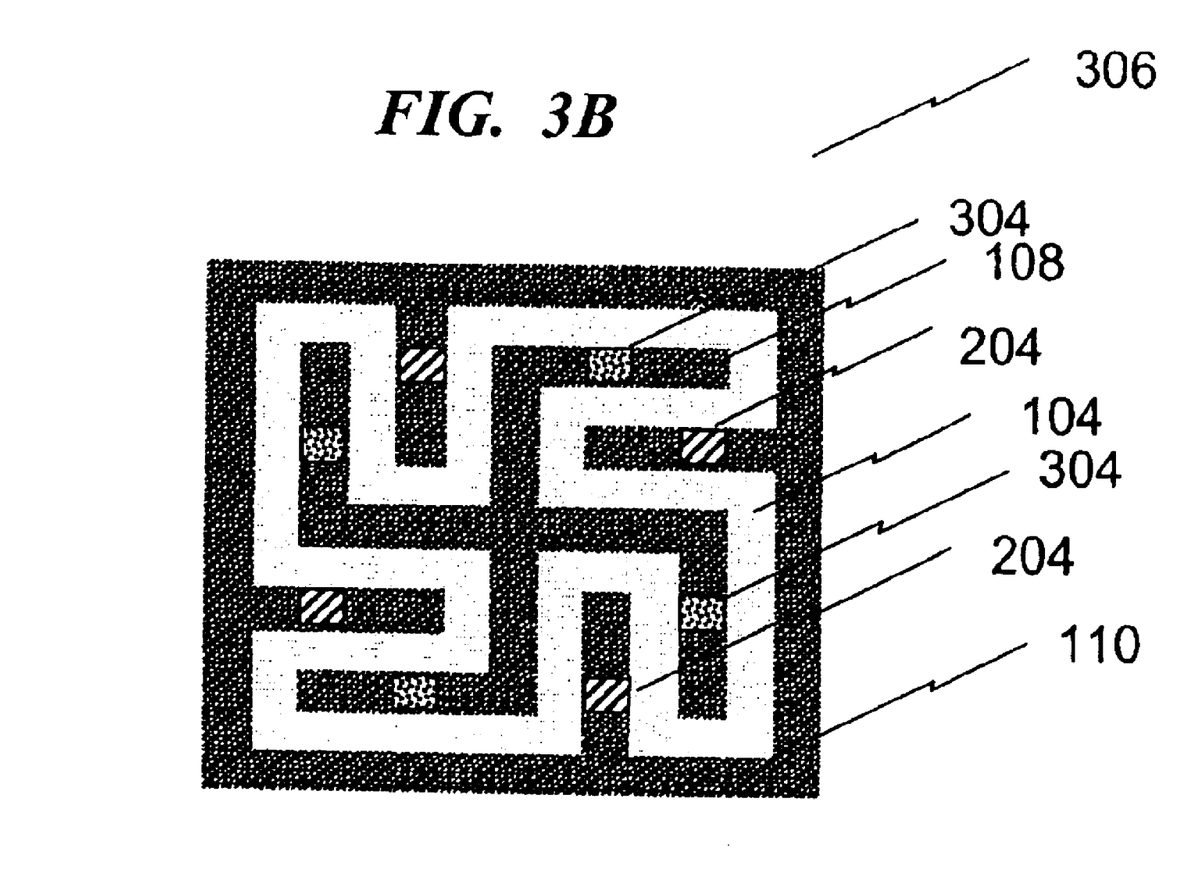
FIG. 3B illustrates one embodiment for the via layout for FIG. 1B to connect each polarity parallel electrode to the like polarity electrode in an upper or lower layer.

Referring now to FIG. 3A and 3B, capacitor structure 300 illustrates one embodiment for a via interconnect scheme to capacitor structure 306 for both polarity of electrodes. The center piece electrode 102 is separated from the frame piece electrode 106 by the dielectric 104. Via locations 202 on the center piece 102 in layer 300 are interconnected to via locations 204 on the frame piece 110 in layer 306 through an intervening layer of the dielectric 104 separating layers 300 and 306. In kind, via locations 302 on the frame piece electrode 106 in layer 300 are interconnected to via locations 304 on the center piece 108 in layer 306 through an intervening layer of dielectric 104 separating layers 300 and 306.

Figure 3C:
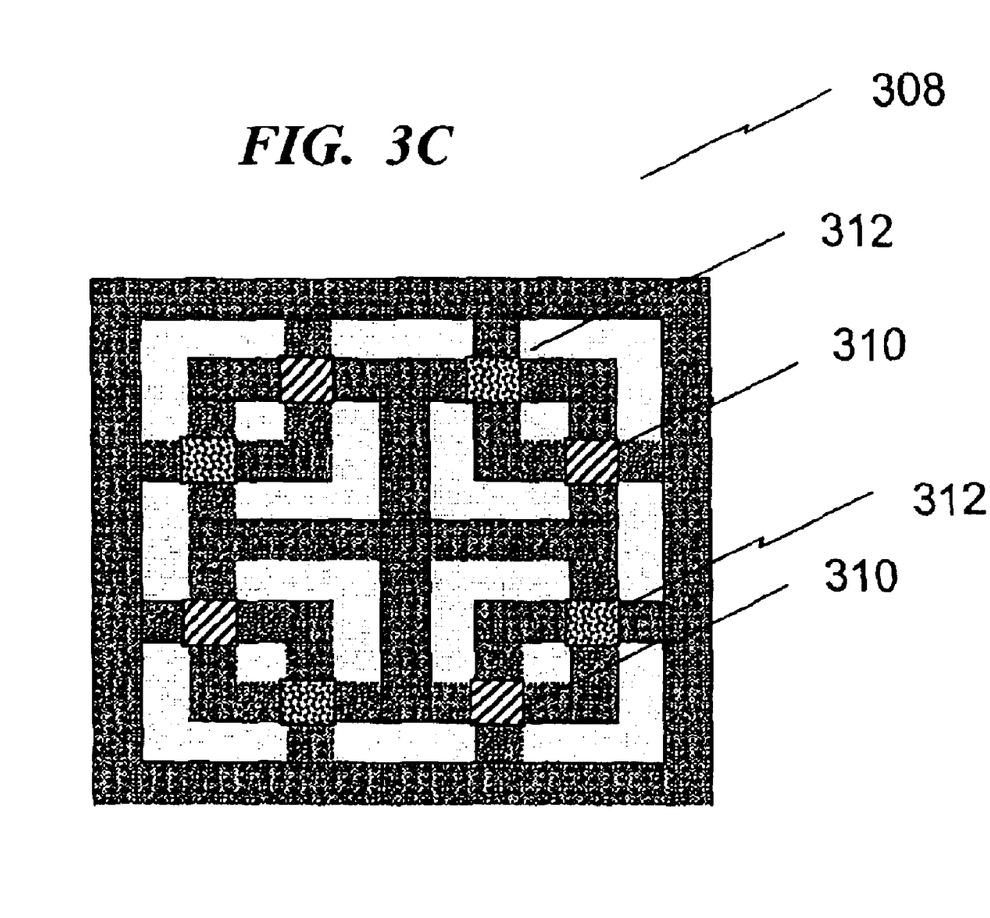
FIG. 3C illustrates the overlay of via layouts for FIG. 1A and FIG. 1B to connect each polarity parallel electrode to the like polarity electrode in an upper or lower layer competing the a capacitor device unit cell.

FIG. 3C is a top view showing the footprints of the stacked MOM device 308. The layers 300 and 306 are stacked together vertically to comprise a substantially vertical capacitor structure. Via locations 310 correspond to the interconnects of one polarity electrode of the capacitor and via locations 312 correspond to the interconnects of the second polarity electrode of the capacitor structure.

Figure 4:
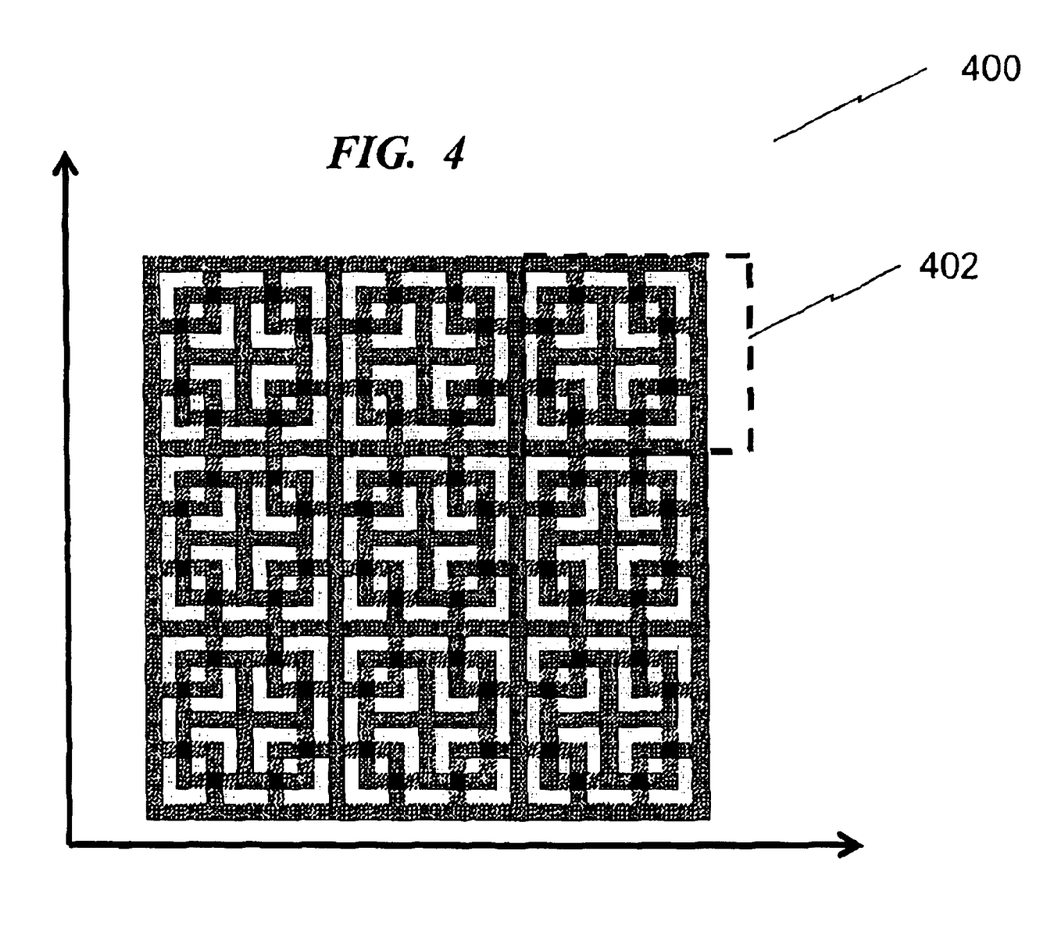
FIG. 4 illustrates a device group array comprised of the unit cell devices.

What have been shown from FIG. 1A to FIG. 3C are only one modular unit of the capacitor. In the actual use, more than a single unit is needed. Turning next to FIG. 4, a stacked capacitor device group 400 is shown that is made from individual unit cells 402. The units are arrayed in three dimensions yielding a modular capacitor array design suitable for incorporation into a library of circuit design tools. FIG. 4 also illustrates the increase in packing density and lateral capacitance achieved when the unit cell 308 is arrayed and the adjacent unit cells share a common inside unit cell perimeter edge.

When manufacturing a multilevel metal-over-metal (MOM) device group, one or more MOM devices is initially formed on a first layer. Standard metal photolithographical and etching or deposition processes are used. A CMP is applied to flatten the metal. A dielectric layer is then put on top of the first metal layer. Then, one or more MOM devices on a second layer are formed that are vertically aligned with the MOM devices on the first layer. The MOM devices the first and second layers are then connected so that portions of the devices on both layers having a same voltage level are connected together.

As described and shown above, the device cell should be easily scaled, arrayed and incorporated eliminating requirements for additional DRC (design rule check) when implemented. They are compatible with standard integrated circuit processing, require no additional processing steps. They are extremely suitable for fabrication with CMP (chemical mechanical polishing) as each layer of metal can be separately processed and expected to be flat. Furthermore, the unit cell capacitor structure provides the maximum interconnection flexibility for integration into circuit design layouts.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A metal-over-metal (MOM) device having at least one device cell on a first layer, each cell comprising:
   a frame piece; and
   a center piece surrounded by the frame piece having a cross-shape center portion defining four quadrants of space between the frame and center pieces;
   wherein the center piece has one or more center fingers each extending from at least one of the four ends thereof within a quadrant;
   wherein the frame piece has one or more frame fingers extending therefrom and each being in at least one quadrant and not being overlapped with the center finger in the same quadrant.

2. The device of claim 1 wherein a first set of two center fingers being parallel to each other and extending towards a first and second opposite directions.

3. The device of claim 2 wherein a second set of two extended center fingers being parallel to each other and extending towards a third and fourth opposite directions.

4. The device of claim 3 wherein the frame finger is parallel with the center finger in the same quadrant.

5. The device of claim 4 wherein the first and second sets of the center fingers are perpendicular to each other.

6. The device of claim 4 wherein the center finger is perpendicular to a first portion of the cross shape center piece that it extends from.

7. The device of claim 4 wherein the frame finger is situated on an inner side of the center finger so that it is closer to the center of the center piece.

8. The device of claim 1 further comprising one or more connection points on the center and frame fingers of the device cell on the first layer connecting to at least one MOM device cell on a second layer vertically aligned therewith, wherein the center finger on the first layer connects to a frame finger of the MOM device cell on the second layer, and the frame finger on the first layer connects to a center finger of the MOM device cell on the second layer.

9. The device of claim 1 wherein at least one side of the frame piece is connected to an external connection point.

10. The device of claim 1 wherein the frame piece is at a first voltage level and the center piece is at a second voltage level.

11. A multilevel metal-over-metal (MOM) device group having one or more MOM devices on a first layer connected to one or more MOM devices on a second layer, each of the MOM devices comprising:
    a frame piece; and
    a center piece surrounded by the frame piece having a cross-shape center portion defining four quadrants of space between the frame and center pieces, the center portion having a horizontal component and a vertical component;
    wherein the center piece has four center fingers each extending from one of the four ends thereof and being parallel to either the horizontal or the vertical component of the center portion, and wherein each quadrant has only one such center finger;
    wherein the frame piece has four frame fingers each extending from one side thereof, each being in one quadrant and being parallel with the center finger in the same quadrant.

12. The device group of claim 11 further comprising one or more connection points on the center and the frame fingers for connecting each device on the first layer to at least one device on the second layer.

13. The device group of claim 12 wherein the frame fingers of the devices on the first layer connect to the center fingers of the devices vertically aligned therewith on the second layer through the connection points.

14. The device group of claim 12 wherein the center fingers of the devices on the first layer connect to the frame fingers of the devices vertically aligned therewith on the second layer through the connection points.

15. The device group of claim 11 wherein a center finger extending from an end of the center portion of a first device on the first layer is in a different quadrant than the quadrant in which a center finger extending from a same end of center portion of a second device on the second layer connected with the first device.

16. The device group of claim 15 wherein the center finger of the first device and the center finger of the second device extend in opposite directions.

17. The device group of claim 15 wherein the frame piece of the first device and the center piece of the second device are on a first voltage level.

18. The device group of claim 17 wherein the center piece of the first device and the frame piece of the second device are on a second voltage level.

19. The device group of claim 15 wherein the frame finger is closer to the center of the cross-shape center portion than the center finger in the same quadrant.

* * * * *